United States Patent [19]

Park

[11] Patent Number: 5,650,781
[45] Date of Patent: Jul. 22, 1997

[54] APPARATUS FOR DECODING VARIABLE LENGTH CODES

[75] Inventor: Yong-Gyu Park, Seoul, Rep. of Korea

[73] Assignee: Daewoo Electronics Co., Ltd., Seoul, Rep. of Korea

[21] Appl. No.: 367,523

[22] Filed: Dec. 30, 1994

[30] Foreign Application Priority Data

Jan. 18, 1994 [KR] Rep. of Korea .................... 94-782

[51] Int. Cl.$^6$ ............................................. H03M 7/40
[52] U.S. Cl. ............................ 341/67; 341/65; 341/141
[58] Field of Search ..................... 341/65, 67, 141

[56] References Cited

U.S. PATENT DOCUMENTS

| | | | |
|---|---|---|---|
| 4,899,149 | 2/1990 | Kahan | 341/67 |
| 5,173,695 | 12/1992 | Sun et al. | 341/67 |
| 5,345,236 | 9/1994 | Sramek, Jr. | 341/144 |
| 5,432,512 | 7/1995 | Park | 341/67 |

OTHER PUBLICATIONS

Shih-Fu Chang et al., "Designing High-Throughput VLC Decoder Part I-Concurrent VLSI Architectures", IEEE Transactions on Circuits and Systems for Video Technology, vol. 2, No. 2, pp. 187–196, Jun. 1992.

Horng-Dar Lin et al., "High Throughput Reconstruction of Huffman-Coded Images", 1989 IEEE International Conference on Computer Design: VLSI in Computers & Processors, pp. 172–175, Oct. 2–4, 1989.

Primary Examiner—Jeffrey A. Gaffin
Assistant Examiner—Jason L. W. Kost
Attorney, Agent, or Firm—Anderson Kill & Olick PC

[57] ABSTRACT

A variable length code(VLC) decoding apparatus for simultaneously decoding two different VLC bit streams includes two storage units, in response to each read signal, for storing fixed length segments contained in each of the VLC bit streams; a first switch for selecting the fixed length segments from a first or a second storage unit, and for selecting a first or a second window control signal; a barrel shifter in response to selected window control signal for forming a decoding window on the selected segments in order to produce a decoding window output sequence thereof; a memory for producing a decoded word in response to a variable length codeword and for producing a codeword length output; a second switch, in response to a second selection signal, for producing the decoded word and the codeword length output as a first decoded word and a first codeword length or a second decoded word and a second codeword length output; two accumulators, in response to each of the codeword lengths, for generating the two window control signals and a first and a second pre-read signals; and a control unit, in response to the two window control signals and the two pre-read signals, for producing the two selection signals and the two read signals in order to enable the two different VLC bit streams to be decoded simultaneously.

1 Claim, 2 Drawing Sheets

FIG. 2

| | A | B | C | D | E | F | G | H | I | J | K | L | M | N | O | P |
|---|---|---|---|---|---|---|---|---|---|---|---|---|---|---|---|---|
| PROCESS 10 | ○ | | | | | | | ○ | | | | | ○ | | | ○ |
| PROCESS 20 | | X | | | | | | | | | | | | | | |
| PROCESS 30 | | | | | | | X | | | X | | X | | ○ | X | |
| PROCESS 40 | | | ○ | ○ | X | ○ | ○ | X | ○ | ○ | ○ | ○ | | | ○ | |
| PROCESS 50 | | | | X | ○ | X | | | X | | | | X | | | X |

(○: PROCESS FOR FIRST VLC BIT STREAM
X: PROCESS FOR SECOND VLC BIT STREAM)

APPARATUS FOR DECODING VARIABLE LENGTH CODES

FIELD OF THE INVENTION

The present invention relates to a variable length code (VLC) decoding apparatus; and, more particularly, to a VLC decoding apparatus which is capable of simultaneously decoding two different VLC streams independently supplied from two channels.

DESCRIPTION OF THE PRIOR ART

Variable length coding is a technique often used for lossless data compression. This technique is used to convert fixed-length data to variable-length codewords based on the statistical occurrences of the data. The length of the codewords is chosen in such a manner that shorter codewords are used to represent more frequently occurring data and longer codewords are selected to represent less frequently occurring data. By properly assigning the variable-length codewords to a library of all possible source codewords, the average word length of the variable-length codewords becomes shorter than that of the original data, thereby rendering it possible to achieve data compression.

In this connection, Huffman code design is a procedure commonly used to construct a variable length code for a known data statistic. In general, the encoding process can be implemented by using a table-lookup process using input data to address the table. The codewords and the wordlength information are stored as contents of the table and outputted sequentially through the use of a buffer at a constant data rate onto the data channel.

At the receiving end, however, the decoding process is more complicated. Owing to the variable length nature, each codeword has to be segmented from the received bit stream before it can be decoded into a source symbol. Therefore, the design of a VLC decoding apparatus is more difficult than that of a variable length encoder.

There are several known apparatus for use to decode a stream of variable-length codewords. Among them, more widely accepted is a VLC decoding apparatus employing a tree-searching algorithm such as the one disclosed in U.S. Pat. No. 4,899,149 issued on Feb. 6, 1990 to Gary Kahan. In this device, a VLC is represented by a tree with codewords as leaves(also called terminal nodes). The decoding process starts from the root of the code tree and is guided by the received bit stream to follow one of two branches at each node. When a leaf is reached, the end of a codeword is detected and is segmented from the remaining bit stream. This type of decoding apparatus includes a logic circuitry corresponding to the tree and a control circuitry to traverse the code tree. This approach may be slow, however, especially for long codewords, since a bit-by-bit search through the code tree is required for each decoded symbol.

A lookup-table based VLC decoding apparatus is disclosed in U.S. Pat. No. 5,173,695 issued on Dec. 22, 1992 to Ming-Ting Sun, et al. That decoding apparatus includes two cascaded latch circuits, each having a bit capability equal to the maximum codeword length, which store consecutive bits supplied from an input buffer memory for storing the bit stream to be decoded in fixed-length data segments; a barrel shifter connected to the two latch circuits for providing a sliding decoding window output equal in length to the maximum codeword length; an accumulator which accumulates the lengths of sequentially decoded variable length codewords; and a lookup-table memory device for outputting a decoded word corresponding to a variable-length codeword contained in the sliding decoding window output and for outputting a length of the variable-length codeword. As a codeword is decoded during each clock cycle, its length is accumulated and the decoding window of the barrel shifter is shifted to begin with the first bit of a codeword to be decoded next. When, during a clock cycle, the accumulated length exceeds the maximum codeword length, which would indicate that all the bits in the second latch circuit have been decoded, the bits in the first latch circuit are transferred into the second latch circuit and the next fixed-data segment of bits is read into the first latch circuit from the input buffer memory.

In the afore-described lookup-table based decoder, since one VLC decoder processes only one VLC bit stream, two separate VLC decoders are required to process two different VLC bit streams, requiring two barrel shifters and two VLC tables.

SUMMARY OF THE INVENTION

It is, therefore, a primary object of the present invention to provide a VLC decoding apparatus capable of simultaneously processing two different VLC bit streams supplied from two separate channels by employing one barrel shifter and one VLC table.

In accordance with the present invention, there is presented a VLC decoding apparatus for simultaneously decoding two different VLC bit streams separately supplied from a first input buffer and a second input buffer, each of the input buffers storing an input bit stream to be decoded in fixed length segments having a length equal to the longest length of the variable-length codewords contained in each of the VLC bit streams, said apparatus comprising:

first storage means, in response to a first read signal, for storing two consecutive fixed length segments from the first input buffer;

second storage means, in response to a second read signal, for storing two consecutive fixed length segments from the second input buffer;

first selection means, in response to a first selection signal, for selecting the two consecutive fixed length segments from the first or the second storage means, and for selecting a first or a second window control signal;

barrel shifter means, in response to the selected window control signal, for forming a decoding window on the selected two consecutive segments in order to produce a decoding window output sequence thereof, the decoding window output sequence having a bit length equal to the longest length of the variable-length codewords;

memory means for producing a decoded word in response to a variable length codeword that begins at the first bit position of the decoding window output sequence and for producing a codeword length output corresponding to the decoded variable length codeword;

second selection means, in response to a second selection signal, for producing the decoded word and the codeword length output as a first decoded word and a first codeword length, or as a second decoded word and a second codeword length output;

first accumulator means, for adding the first codeword length output to a previously accumulated first codeword length output to thereby generate the first window control signal indicating an accumulated codeword length output if the accumulated length output is not greater than the longest length of the variable length codewords, and set the accumulated codeword length output to zero and generate a first pre-read signal if the accumulated codeword length output is greater than the longest length of the variable length codewords;

second accumulator means, for adding the second codeword length output to a previously accumulated second codeword length output to thereby generate the second window control signal indicating an accumulated codeword length output if the accumulated length output is not greater than the longest length of the variable length codewords, and set the accumulated codeword length output to zero; and generate a second pre-read signal if the accumulated codeword length output is greater than the longest length of the variable length codewords; and control means, in response to the first and the second window control signals and the first and the second pre-read signals, for producing the first and the second selection signals and the first and the second read signals in order to enable the two different VLC bit streams to be decoded simultaneously.

BRIEF DESCRIPTION OF THE DRAWINGS

The above and other objectives and features of the instant invention will become apparent from the following description of preferred embodiments taken in conjunction with the accompanying drawings, in which:

FIG. 2 provides an explanatory diagram for illustrating the operation of the VLC decoding apparatus shown in FIG. 1.

DETAILED DESCRIPTION OF THE PREFERRED EMBODIMENTS

Figure 1:
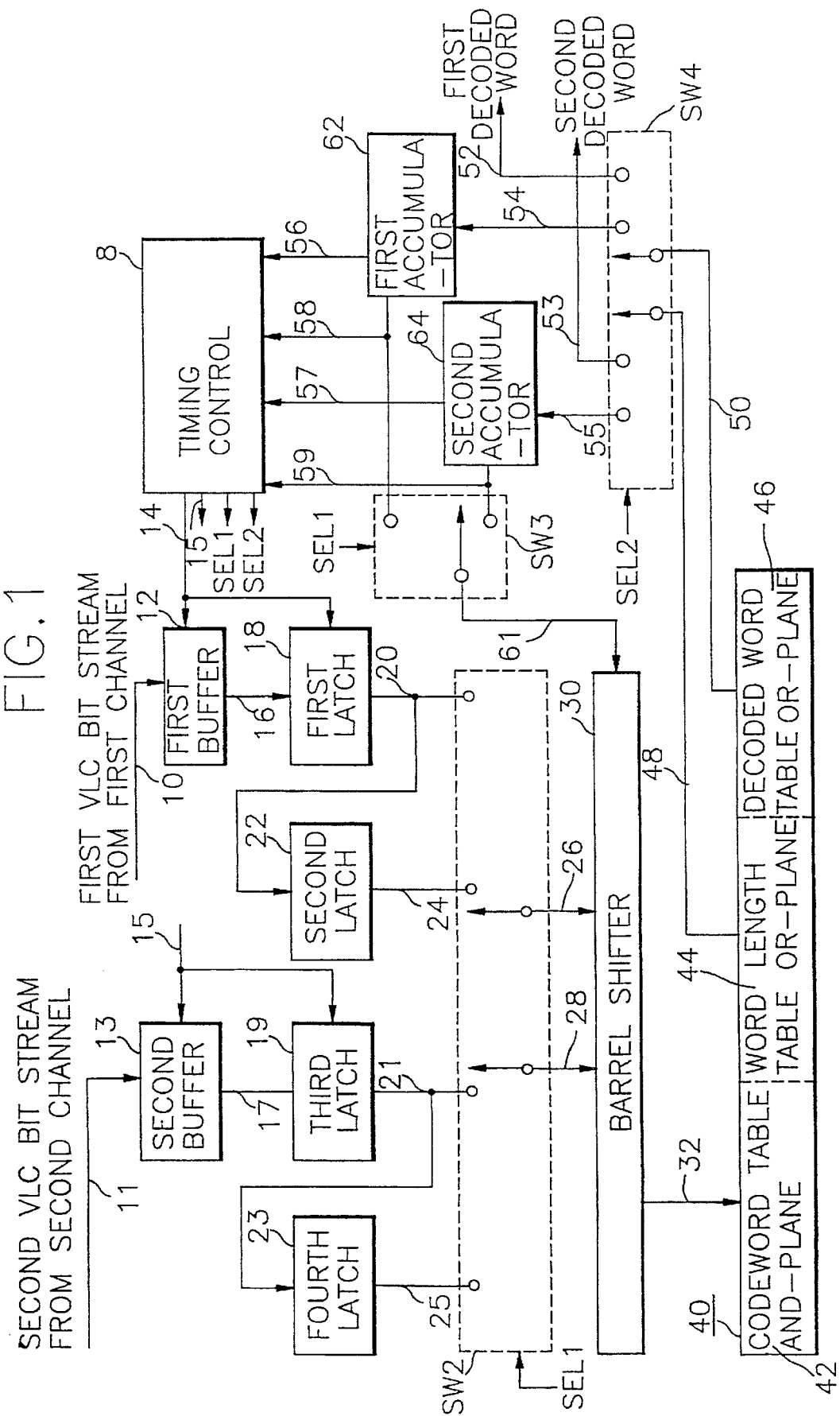
FIG. 1 describes a preferred embodiment of a VLC decoding apparatus in accordance with the present invention.

A VLC decoding apparatus in accordance with a preferred embodiment of the present invention is shown in FIG. 1. The VLC decoding apparatus simultaneously decodes variable-length codewords contained in two different VLC bit streams and outputs two decoded words corresponding thereto. It is assumed that the maximum length of the variable-length codeword is 16 bits.

As shown in FIG. 1, two different VLC bit streams are provided from each channels(not shown). A first VLC bit stream received on a lead 10 is inputted to a first buffer memory 12 which stores the first VLC bit stream and sequentially outputs fixed length segments having a length equal to the longest length of the variable-length codewords, e.g., 16-bit segments on a lead 16 in response to a first read signal on a lead 14 from a timing control block 8.

A first latch circuit 18 is connected to the first buffer memory 12 and serves to sequentially receive the fixed length data segments in response to the first read signal on the lead 14. A second latch circuit 22 is connected to the first latch circuit 18 and functions to receive the fixed length data segments previously held in the first latch circuit 18. When a new data segment needs to be supplied, a first read signal is activated on the lead 14. In response thereto, the first buffer memory 12 supplies the next data segment on the lead 16; the first latch circuit 18 receives the next data segment; and the data segment previously held in the first latch circuit 18 is transferred to the second latch circuit 22. Thus, the second latch circuit 22 contains the data segment which precedes the one contained in the first latch circuit 18. The two data segments contained in the first and second latch circuits 18 and 22 comprise a 32-bit sequence of the first VLC bit stream, which is twice the maximum length of the variable-length codeword. The two data segments in the first and the second latch circuits 18 and 22 are consistently inputted, via parallel leads 20 and 24, to a barrel shifter 30 through a switch SW2 until a new first read signal is activated.

In the meantime, a second VLC bit stream received on a lead 11 is supplied to a second buffer memory 13 which stores the second VLC bit stream and outputs fixed length data segments, e.g., 16-bit segments on a lead 17 in response to a second read signal from the timing control block 8 via a lead 15, wherein the bit length of the data segments is identical to the maximum bit length of the variable-length codeword.

A third latch circuit 19 is connected to the second buffer memory 13 and serves to sequentially receive the fixed-length data segments in response to the second read signal on the lead 15 from the timing control block 8. A fourth latch circuit 23 is connected to the third latch circuit 19 and functions to receive the fixed length segment previously held in the third latch circuit 19. When a new data segment needs to be supplied, a second read signal is activated on the lead 15. In response thereto, the second buffer memory 13 supplies the next data segment on the lead 17; the third latch circuit 19 receives the next data segment; and the data segment previously held in the third latch circuit 19 is transferred through a lead 21 to the fourth latch circuit 23. The two data segments contained in the third and the fourth latch circuits 19 and 23 comprise a 32-bit sequence of the second VLC bit stream to be decoded, which is twice the size of the maximum variable length codeword. The two data segments in the third and the fourth latch circuits 19 and 23 are consistently inputted, via parallel leads 21 and 25, to the barrel shifter 30 through the switch SW2 until a next second read signal on the lead 15 is activated.

The switch SW2 is responsive to a first selection signal SEL1 fed from the timing control block 8 to selectively provide one of the two 32-bit fixed length segments to the barrel shifter 30.

The selected 32-bits from the SW2 are inputted to the barrel shifter 30 over parallel leads 26 and 28. As will be described below, when a first window control signal on a lead 58 from a first accumulator 62 or a second window control signal on a lead 59 generated by a second accumulator 64 is selectively provided on a lead 61 through a switch SW3 which is controlled by the first selection signal SEL1, the barrel shifter 30 forms a 16-bits decoding window on the 32-bits inputs. The 16-bits decoding window is shifted across the 32-bit inputs on leads 26 and 28 and its position is directly determined by the first or the second window control signal inputted through the lead 61. Each of the window control signals indicates a shift of decoding window between zero and fifteen. A window control signal of "0" indicates that the decoding window encompasses the first through sixteenth bit on leads 26 and 28, while a window control signal of "15" indicates that the decoding window encompasses the sixteenth bit through the thirty-first bit. After forming the decoding window, the barrel shifter 30 produces a decoding window output sequence to a look-up table via a lead 32.

In the preferred embodiment of the invention, the look-up table 40 is implemented by a programmable logic array (PLA). The look-up table 40 shown in FIG. 1 is shown to comprise a codeword table AND-plane 42, a word length table OR-plane 44 and a decoded word table OR-plane 46. As is also described in U.S. Pat. No. 5,173,695, each codeword is represented as an entry in the codeword table AND-plane 42 according to the bit pattern of variable-length codewords.

A variable-length codeword is detected when a sequence from the barrel shifter 30 matches one of the variable-length codeword bit patterns stored in the codeword table AND-plane 42. Thus, for instance, if one of the variable-length codeword bit pattern is "01", and the 16-bit sequence from the barrel shifter 30 has a pattern "0111110000011101", then a match occurs on the first two bits. The first two bits are thus recognized as a variable-length codeword and the next word begins with the third bit.

When a decoding window output sequence on the lead 32 matches an entry in the codeword table AND-plane 51, the entry in the word length table OR-plane 44 and the entry in the decoded word table OR-plane 46 are activated.

The word length table OR plane 44 produces a word length signal on a lead 48, which indicates the length of the matched variable-length codeword in the codeword table 42. For the example above, the word length table 44 outputs "2", representing the length of the detected word "01". And then, the word length is inputted to a switch SW4.

The decoded word table OR-plane 46 outputs onto a lead 50 the decoded word corresponding to the matched variable-length codeword in the codeword table AND plane 42. The decoded word on the lead 50 is provided to the switch SW4.

The switch SW4 is responsive to a second selection signal SEL2 from the timing control block 8, to classify the decoded words and lengths from the look-up table 40 into the first and the second ones, i.e., if a decoded word belongs to the first VLC bit stream, it is outputted onto a lead 52 as a first decoded word and a codeword length signal thereof is provided to a first accumulator 62 via a lead 54. If a decoded word is a part of the second VLC bit stream, it is outputted onto a lead 53 as a second decoded word and a codeword length signal thereof is provided to a second accumulator 62.

Each of the first and the second accumulators 62 and 64 serves to add the codeword length of present decoded word with the previous accumulated codeword lengths after each variable-length codeword is detected. If new accumulated sum does not exceeds, the value of new added length calculated at the first 62 or the second accumulator 64 is provided to the barrel shifter 30 as the first or the second window control signal illustrated in the above barrel shifter 30. In response to the first or the second window control signal, the position of the decoding window is shifted between zero and fifteen.

However, when new accumulated sum exceeds fifteen, each of the accumulators 62 and 64 activates pre-read signals onto leads 56 and 57 and sets the previous accumulated codeword lengths to zero. Each of the pre-read signals indicates that all the bits stored in the second 22 or the fourth latch circuits 23 have been decoded and can now be discarded. The first and the second pre-read signal on leads 56 and 58 are provided to the timing control block 8, respectively.

The timing control block 8, in responsive to the first and the second pre-read signals and the first and the second window control signals, determines the actuating time of the first and the second read signals onto the leads 14 and 15 respectively, and supplies the selection signals SEL1 and SEL2 to the switches SW1, SW3 and SW4 in order to enable the two different VLC bit streams to be decoded simultaneously.

The operation of the VLC decoding apparatus in FIG. 1 may be more readily understood with reference to an example shown in tabular form in FIG. 2. In each cell of the first column of FIG. 2, there are five processes 10,20,30,40 and 50, which are:

The process 10 is a part of the entire operation, i.e., in response to the first read signal on the lead 14, to store two fixed length segments of the first VLC bit stream at the two latches 18 and 22;

The process 20 is responsive to a second read signal on lead 15 to store two fixed length segments of the second VLC bit stream at two latches 19 and 23;

The process 30 is an operation of the barrel shifter 30 and the look-up table 40. That is, in response to a window control signal on the lead 61, to form a decoding window on the leads 26 and 28; to produce a decoding window output sequence onto the lead 32; and to produce a decoded word and a codeword length onto the leads 48 and 50, respectively.

The process 40 is an operation of the first accumulator 62, which adds a first length on lead 54 to a previously accumulated length to produce the first window control signal onto the lead 58 or to supply the first pre-read signal onto the lead 56; and The process 50 is an operation of the second accumulator 64 which adds a second length on the lead 55 to a previously accumulated length to produce the second window control signal onto lead 59 or to supply the second pre-read signal onto lead 57.

In the meantime, the first row of FIG. 2, there are shown symbols "A" to "P" in each cell, each of the symbols indicates a predetermined processing time. And, a series of the decoding process for the first VLC bit stream is represented by "O", while each of the second VLC bit stream decoding processes is illustrated by "X". It is assumed that each of the processing times is equivalent.

In a processing time "A" of FIG. 2, there is only one decoding process, i.e., a process 10. In the beginning of decoding the two different VLC bit streams, the starting processing time of first VLC bit stream decoding operation is earlier one time than that of the second VLC bit stream decoding operation. In processing time "A", the timing control block 8 activates the first read signal on the lead 14 and stores two consecutive fixed length segments of the first VLC bit stream at the two latches 18 and 22.

In a processing time "B", as the next process of the first VLC bit stream, a process 30 is performed. In order to commence the process 30, the control block 8, after spending a predetermined processing time, i.e. time "A", actuates the switch SW1 with the first selection signal SEL1 so as to couple a set of leads 26 and 28 to a set of the leads 20 and 24. And, at the same time, the control block 8 operates the switch SW3 to provide a first window control signal to the barrel shifter 30.

In the processing time "B", as the first process of the second VLC bit stream decoding operation, i.e., process 20, the control block 8, activates the second read signal on the lead 15 and stores consecutive two fixed length segments of the second VLC bit stream at the two latches 19 and 23.

In a processing time "C", a process 40 is performed for the first VLC bit stream, while a process 30 is accomplished for the second VLC bit stream. In prior to the process 40, the selection signal SEL2 is provided to the SW4 after predetermined time, i.e., time "B",. In response to the SEL2, the switch SW4 provides the first decoded word remaining on the lead 50 to the lead 52 and supplies the first length on lead 48 to the lead 54. In the process 30 for the second VLC bit stream, the control block 8, after spending the time "B", actuates the first selection signal SEL1 so as to couple the set of leads 26 and 28 to the set of the leads 21 and 25. And, the control block 8 operates the switch SW3 to provide a second window control signal to the barrel shifter 30.

As shown in FIG. 2, after the process 40 for the first VLC bit stream, two sort of processes are prepared. One is a new process 30 and the other is a new process 10. If a new accumulated value does not exceeds 15 in the first accumulator 62, the process 30 are performed, for example, from processing time "C" to "D", "E" to "F", or "J" to "K". However, if it exceeds 15, the process 10 is performed, for instance, processing time "G" to "H", "L" to "M", "O" to "P".

In a processing time "D", a process 30 for the first VLC bit stream and a process 50 for the second VLC bit stream are accomplished at the same time. Prior to proceeding the process 50, the selection signal SEL2 is provided to the SW4 after the time "C". At this time, the SEL2 is identical to the SEL1 in the process 30 for the second VLC bit stream. In response to the SEL2, the switch SW4 couples the set of leads 48 and 50 to the set of leads 55 and 53.

After process 50, two sort of processes are prepared. One is process 20 and the other is process 30. If a new accumulated value in the second accumulator 64 does not exceeds 15, the process 30 are performed, for example, from a processing time "D" to "E", but if it exceeds 15, the process 20 is performed, for instance, a processing time "F" to "G".

As shown in FIG. 2, since each of the processes are operates independently, it is possible to simultaneously decode two different VLC bit streams. Since, however, a PROCESS 20 and a PROCESS 40 are performed at the same processing time, for instance, "J", or a PROCESS 10 and a PROCESS 50 operates at the same time, for instance, processing time "M", next decoding processes of the first and second VLC bit streams meet at a PROCESS 30. In this case, the timing control block 8 detects each of the processes 10, 20, 40 and 50 with the signals on the leads 56–59, to delay the process 20 or 50 for the second VLC stream so as to avoid the process collision at the process 30.

While the present invention has been shown and described in connection with the preferred embodiments only, it will be readily apparent to those of ordinary skill in the art that many changes and modifications may be made without departing from the spirit and scope of the invention as defined in the appended claim.

What is claimed is:

1. A variable length code(VLC) decoding apparatus for simultaneously decoding two different VLC bit streams separately supplied from a first input buffer and a second input buffer, each of the input buffers storing an input bit stream to be decoded in fixed length segments having a length equal to the longest length of the variable-length codewords contained in each of the VLC bit streams, said apparatus comprising:

first storage means, in response to a first read signal, for storing two consecutive fixed length segments from the first input buffer;

second storage means, in response to a second read signal, for storing two consecutive fixed length segments from the second input buffer;

first selection means, in response to a first selection signal, for selecting the two consecutive fixed length segments from the first or the second storage means;

second selection means, in response to the first selection signal, for selecting a first or a second window control signal;

barrel shifter means, in response to the selected window control signal, for forming a decoding window on the selected two consecutive segments in order to produce a decoding window output sequence thereof, the decoding window output sequence having a bit length equal to the longest length of the variable-length codewords;

memory means for producing a decoded word in response to a variable length codeword that begins at the first bit position of the decoding window output sequence and for producing a codeword length output corresponding to the decoded variable length codeword;

third selection means, in response to a second selection signal, for producing the decoded word and the codeword length output as a first decoded word and a first codeword length, or as a second decoded word and a second codeword length output;

first accumulator means for adding the first codeword length output to a previously accumulated first codeword length output to thereby generate the first window control signal indicating an accumulated codeword length output if the accumulated length output is not greater than the longest length of the variable length codewords; and generate a first pre-read signal if the accumulated codeword length output is greater than the longest length of the variable length codewords;

second accumulator means, for adding the second codeword length output to a previously accumulated second codeword length output to thereby generate the second window control signal indicating an accumulated codeword length output if the accumulated length output is not greater than the longest length of the variable length codewords; and generate a second pre-read signal if the accumulated codeword length output is greater than the longest length of the variable length codewords; and control means, in response to the first and the second window control signals, for producing the first and the second selection signals and, in response to the first and the second pre-read signals, for producing the first and the second read signals in order to enable the two different VLC bit streams to be decoded simultaneously.

* * * * *